(12) United States Patent
Ichikawa et al.

(10) Patent No.: US 8,610,338 B2
(45) Date of Patent: Dec. 17, 2013

(54) TUNING-FORK TYPE PIEZOELECTRIC VIBRATING PIECE WITH ENHANCED FREQUENCY ADJUSTMENT AND PIEZOELECTRIC DEVICE INCORPORATING SAME

(71) Applicant: Nihon Dempa Kogyo Co., Ltd., Tokyo (JP)

(72) Inventors: Ryoichi Ichikawa, Saitama (JP); Hiroki Iwai, Saitama (JP); Yoshiaki Amano, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 0 days.

(21) Appl. No.: 13/714,806

(22) Filed: Dec. 14, 2012

(65) Prior Publication Data

US 2013/0119823 A1    May 16, 2013

Related U.S. Application Data

(63) Continuation of application No. 12/641,977, filed on Dec. 18, 2009, now abandoned.

(30) Foreign Application Priority Data

Dec. 22, 2008    (JP) ................. 2008-324891

(51) Int. Cl.
*H03H 9/19* (2006.01)
(52) U.S. Cl.
CPC ..................... *H03H 9/19* (2013.01)
USPC ........................................................ 310/370

(58) Field of Classification Search
CPC ....................................................... H03H 9/19
USPC ........................................................ 310/370
See application file for complete search history.

(56) References Cited

U.S. PATENT DOCUMENTS

| 6,065,339 | A | 5/2000 | Takeuchi et al. |
| 7,521,846 | B2 | 4/2009 | Tanaya |
| 7,626,318 | B2 | 12/2009 | Dalla Piazza et al. |
| 2010/0201229 | A1 | 8/2010 | Saito |

FOREIGN PATENT DOCUMENTS

| JP | 197581173 | 7/1975 |
| JP | 54053889 | 4/1979 |
| JP | 57068924 | 4/1982 |
| JP | 2002185282 | 6/2002 |
| JP | 2003133885 | 5/2003 |
| JP | 2004208237 | 7/2004 |
| JP | 2004282230 | 10/2004 |

(Continued)

*Primary Examiner* — J. San Martin
(74) *Attorney, Agent, or Firm* — Alix, Yale & Rista, LLP

(57) ABSTRACT

A tuning-fork type piezoelectric vibrating piece (20) is comprised of a base portion (23) comprising a piezoelectric material, a pair of vibrating arms (21) extends parallel from the base portion with a first thickness, a excitation electrode film (33, 34) formed on the vibrating arms, a pair of tuning portions (28) formed at the distal ends of the vibrating arms (21) with a second thickness which is less than the first thickness; and a metal film (18) formed on at least one surface of the tuning portion.

7 Claims, 13 Drawing Sheets

(56) References Cited

FOREIGN PATENT DOCUMENTS

| | | |
|---|---|---|
| JP | 2005150992 | 6/2005 |
| JP | 2005-354649 | 12/2005 |
| JP | 2006345517 | 12/2006 |
| JP | 2008054273 | 3/2008 |
| JP | 2008085768 | 4/2008 |
| JP | 2010050499 | 3/2010 |
| JP | 2010087575 | 4/2010 |
| JP | 2010103950 | 5/2010 |
| JP | 2010213262 | 9/2010 |
| JP | 2010259090 | 11/2010 |
| JP | 2011166324 | 8/2011 |

FIG.2A Relation between thickness of tuning portion for frequency adjustment and frequency adjustment amount
(constant metal film thickness, constant dimension)
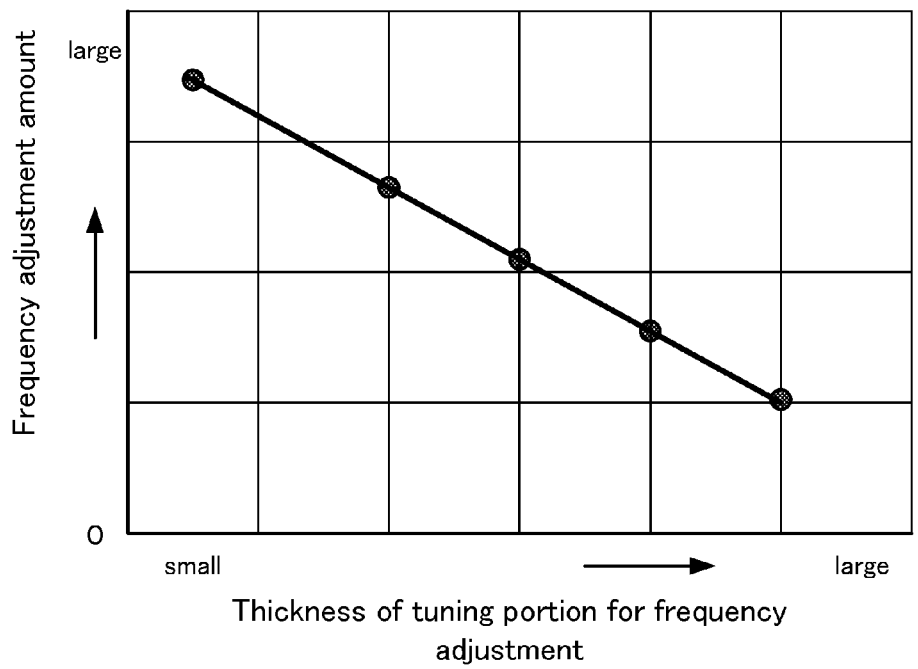
FIG.2B Relation between thickness of metal film of tuning portion for frequency adjustment and frequency adjustment amount
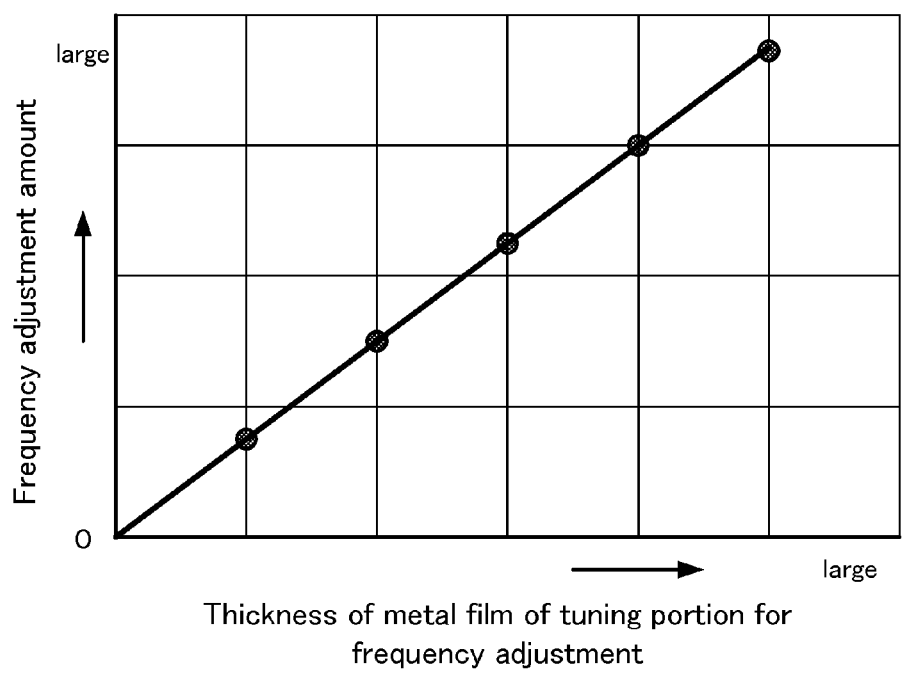

TUNING-FORK TYPE PIEZOELECTRIC VIBRATING PIECE WITH ENHANCED FREQUENCY ADJUSTMENT AND PIEZOELECTRIC DEVICE INCORPORATING SAME

CROSS-REFERENCE TO RELATED APPLICATION

This application is a continuation of U.S. patent application Ser. No. 12/641,977, filed Dec. 18, 2009, which claims priority from Japanese Patent Application No. 2008-324891, filed Dec. 22, 2008, the entire contents of each of which are hereby incorporated by reference.

FIELD

The present disclosure relates to tuning-fork type piezoelectric vibrating pieces made of a piezoelectric material and a manufacturing method of piezoelectric device having the piezoelectric vibrating piece.

DESCRIPTION OF THE RELATED ART

Various types of clocks, home electric appliances, and consumer electronics, and various types of commercial/industrial electrical apparatus such as information/communication devices and Office-Automation devices utilize at least one oscillator. These oscillators typically are manufactured by packaging a piezoelectric resonator, a piezoelectric vibrating device, or an IC chip as a clock source for addition to and use by an electronic circuit of the apparatus. In other apparatus, piezoelectric timing devices such as real-time clock modules are widely used. Especially nowadays, piezoelectric vibrating devices must be increasingly miniaturized and/or provided with a thinner or lower profile so as to be correspondingly accommodated in electronic devices that likewise are miniaturized and/or provided with a lower profile.

As miniaturization of electric devices, miniaturized tuning-fork type piezoelectric vibrating piece for piezoelectric devices used for the electric devices are required. The miniaturized tuning-fork type piezoelectric vibrating piece has a pair of vibrating arms, and the length of arms becomes shorter and width of arms becomes narrower. However, frequency of a tuning-fork type piezoelectric vibrating piece is inversely proportional to the square of the length of vibrating arms so that the shorter arms increase the frequency. According to the Japan Unexamined Patent Application No. 2005-354649, the distal ends of vibrating arms have wider shape. With this configuration, the distal end of vibrating arms become heavier and frequency of a tuning-fork type piezoelectric vibrating piece can be lowered.

Also the '354,649 reference disclosed that a laser beam is irradiated to the frequency controlling film on the distal end of the vibrating arms of tuning-fork type piezoelectric vibrating piece. The laser beam trims a part of the frequency controlling film for controlling frequency. For example, if a tuning-fork type piezoelectric oscillator of surface mount device is in size of 3.2 mm×1.5 mm, the size of frequency controlling film of the vibrating arms of the tuning-fork type piezoelectric vibrating piece to be mounted thereon is 600 μm×100 μm, for example. The miniaturized tuning-fork type piezoelectric oscillator which is SMD is in size of 2.0 mm×1.2 mm, and, the size of frequency controlling film of the vibrating arms of the tuning-fork type piezoelectric vibrating piece to be mounted thereon is 400 μm×60 μm, for example, and the dimensions of film are 1/2.5 smaller than of original dimensions.

However, when the length of vibrating arms becomes shorter and the width of vibrating arms becomes narrower, frequency of each tuning-fork type piezoelectric vibrating piece varies because a crystal wafer are etched by wet-etching method. In order to control the variability of frequency and make it predetermined frequency, a laser beam is irradiated to trim a part of the frequency adjustment film. But, the area of film may be small and frequency adjustment amount on the controlling film also becomes small so that the frequency may not be controlled to a predetermined value.

An object of the disclosed devices and methods is to increase the adjustable range of the amount of frequency adjustment (herein after called "frequency adjustable range") that can be achieved by trimming a tuning portion of metal film formed on the distal end of the vibrating arms even after the tuning-fork type piezoelectric vibrating piece is miniaturized. With this configuration, many small tuning-fork type piezoelectric vibrating pieces manufactured on one single crystal wafer can be tuned to a predetermined frequency.

SUMMARY

A tuning-fork type piezoelectric vibrating piece constructed according to a first aspect of the disclosure comprises a base portion comprising a piezoelectric material, a pair of vibrating arms extending parallel from the base portion with a first thickness, an excitation electrode film formed on the vibrating arms, a pair of tuning portions formed at the distal ends of the vibrating arms with a second thickness which is less than the first thickness of the vibrating arms, and a metal film formed on at least one surface of the tuning portion.

If the frequency of a tuning-fork type piezoelectric vibrating piece is not within a designated value, the metal film of the tuning portion for frequency adjustment is trimmed, but more miniaturized tuning-fork type piezoelectric vibrating piece has a smaller tuning portion so that the frequency adjustment may not perform well. According to the above-mentioned configuration according to the first aspect, frequency adjustable range becomes larger. So, frequency adjustment can be performed even miniaturized tuning-fork type piezoelectric vibrating piece constructed according to the first aspect.

A tuning-fork type piezoelectric vibrating piece according to a second aspect of the disclosure is that a thickness of the excitation electrode film and a thickness of the metal film are the same. That is, although the thickness of the metal film of the tuning portion for frequency adjustment is not formed thick, frequency can be adjusted because frequency adjustable range is larger.

A tuning-fork type piezoelectric vibrating piece according to a third aspect of the disclosure is that at a connection point of thickness from the vibrating arms to the tuning portion, a first width of the vibrating arms and a second width of the tuning portion are different, and the second width is wider than the first width.

A tuning-fork type piezoelectric vibrating piece according to a fourth aspect of the disclosure is that the second width of the tuning portion has a constant width from the distal end of the tuning portion to the connection point.

A tuning-fork type piezoelectric vibrating piece according to a fifth aspect of the disclosure is that the second width of the tuning portion is changed from the distal end of the tuning portion to the connection point.

A tuning-fork type piezoelectric vibrating piece according to a sixth aspect of the disclosure is that from the distal end of the tuning portion to the connection point, the second width is proportional to the inverse number of the frequency adjustment amount per unit of the metal film.

A tuning-fork type piezoelectric vibrating piece according to a seventh aspect of the disclosure is that the tuning portions are configured to oscillate in separate planes whereby said tuning portions do not touch during oscillation.

When the width of tuning portion for frequency adjustment is formed wider, the frequency adjustable range can be larger, but it may also cause a collision of the tuning portions. With the configuration according to the seventh aspect, the tuning portions having wide width do not collide each other.

A piezoelectric device according to an eighth aspect of the disclosure is comprised of the tuning-fork type piezoelectric vibrating piece according to any of preceding aspects, a lid plate covering the piezoelectric vibrating piece, and a base plate supporting the piezoelectric vibrating piece.

A piezoelectric frame according to a ninth aspect of the disclosure is comprised of a pair of vibrating arms extending parallel from the base portion with a first thickness, a excitation electrode film formed from the base portion to the vibrating arms and exciting the vibrating arms, a pair of tuning portions for frequency adjustment formed on distal ends of the vibrating arms with a second thickness which is less than the first thickness of the vibrating arms, a metal film formed on at least one surface on the tuning portion, a pair of supporting arms extends parallel from the base portion with a first thickness at out side of the supporting arms, a frame portion connecting the supporting arms and surrounding the base portion and the vibrating arms.

A tenth aspect of the disclosure relates to a manufacturing method of a tuning-fork type piezoelectric vibrating piece having a pair of vibrating arms extending parallel from the base portion with a first thickness comprising a first exposing step of exposing a profile of the tuning-fork type piezoelectric vibrating piece on a piezoelectric wafer having the first thickness by using a first mask corresponding to the profile of the tuning-fork type piezoelectric vibrating piece, a second exposing step of exposing the tuning portion for frequency adjustment formed on the distal end of the vibrating arms and grooves formed at a root portion of the vibrating arms on the piezoelectric wafer by using a second mask corresponding to the tuning portion for frequency adjustment and the grooves, a first etching step etching the piezoelectric wafer after the first exposing step, and a second etching step etching the piezoelectric wafer after the second exposing step.

According to the above-mentioned configuration, the grooves of the vibrating arms and the tuning portions for frequency adjustment can be formed at once. Without adding extra steps, frequency of miniaturized tuning-fork type piezoelectric vibrating piece can be adjusted.

A piezoelectric vibrating piece according to the present disclosure suppresses degradation of CI value (crystal impedance value) even after miniaturized and also has excellent characteristics. A piezoelectric device using this piezoelectric vibrating piece enables to meet a requirement of miniaturization.

Several embodiments constructed according to aspects of the present disclosure will be explained below by reference to the figures.

BRIEF DESCRIPTION OF THE DRAWINGS

FIG. 2A shows the relation between the thickness D3 of the tuning portion 28 of the vibrating arms 21 for frequency adjustment and frequency adjustment amount.

FIG. 2B shows the relation between the thickness of the metal film 18 of the tuning portion 28 for frequency adjustment and frequency adjustment amount.

DETAILED DESCRIPTION

<Configuration of First Crystal Device 100>

First Embodiment

Figure 1A:
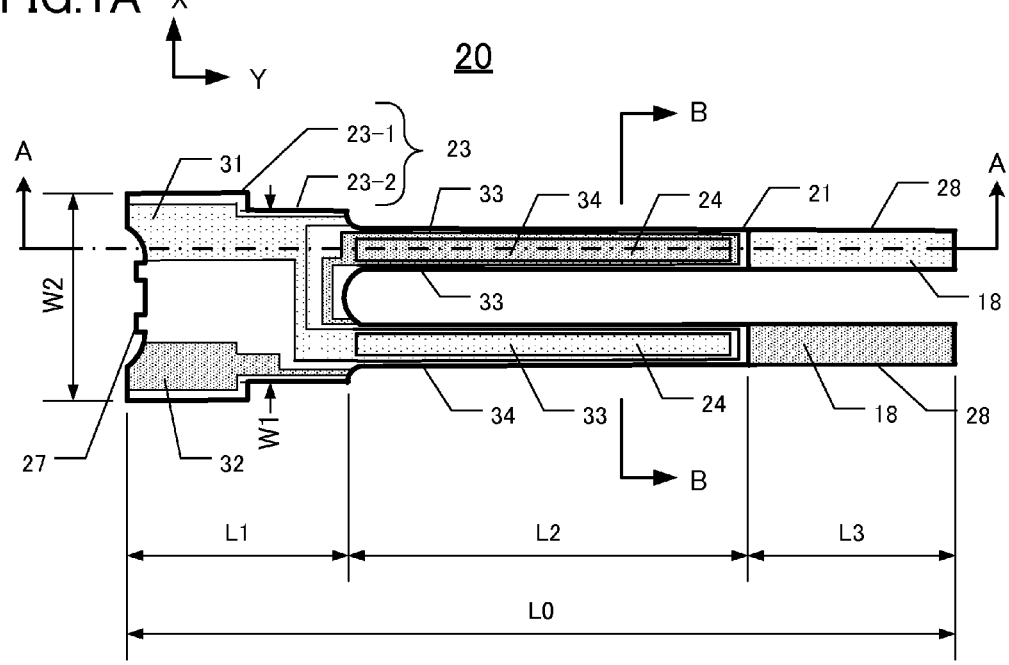
FIG. 1A is a top view showing whole configuration of the first tuning-fork type crystal vibrating piece 20 of first embodiment.
Figure 1B:
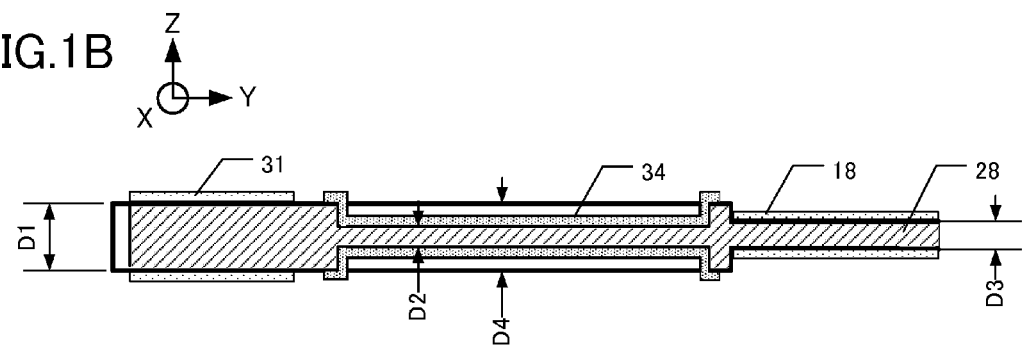
FIG. 1B is a cross-sectional view taken along the A-A line of FIG. 1A.
Figure 1C:
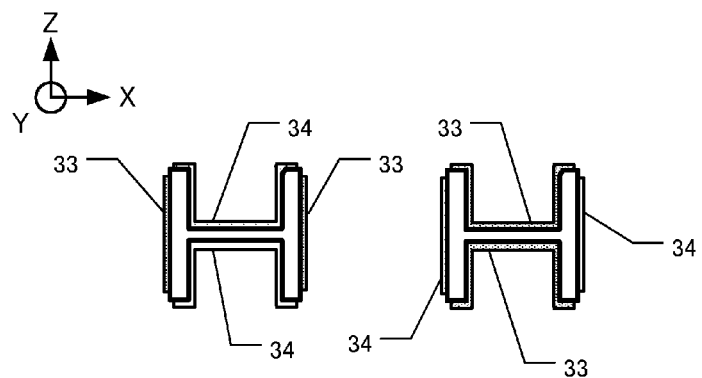
FIG. 1C is a cross-sectional view of a pair of vibrating arms 21 of the first tuning-fork type crystal vibrating piece 20 taken along the B-B line.

FIG. 1A is a top view showing whole configuration of the first tuning-fork type crystal vibrating piece 20 of a first embodiment. FIG. 1B is a cross-sectional view taken along line A-A of FIG. 1A. FIG. 1C is a cross-sectional view of a pair of vibrating arms 21 of the first tuning-fork type crystal vibrating piece 20 taken along line B-B of FIG. 1A. The base material of the first tuning-fork crystal vibrating piece 20 is a Z-cut single crystal wafer. As shown in FIG. 1A, the first tuning-fork type crystal vibrating piece 20 is provided with a base portion 23 comprising a first base portion 23-1 and a second base portion 23-2 and a pair of vibrating arms 21 which is bifurcated and extends parallel from the first base portion 23-1 to the right side of FIG. 1A. Tuning portions 28 for frequency adjustment are formed on the distal ends of vibrating arms 21. Connecting portions 27 are formed on the base portion 23 in order to connect the first tuning-fork type crystal vibrating piece 20 to the single crystal wafer temporarily.

The first tuning-fork type crystal vibrating piece 20 is very small and oscillates at 32.768 kHz. As seen from FIG. 1A, the length L3 of the tuning portion 28 for frequency adjustment is shorter than of conventional art. For example, total length of a length L2 of vibrating arm 21 and the length L3 of the tuning portion 28 is about in a range of 1.20 mm to 1.50 mm, a length L1 of the base portion 23 is about in a range of 0.20 mm to 0.50 mm, and the length L3 of the tuning portion 28 for frequency adjustment is about in a range of 0.40 mm to 0.45 mm. The entire length L0 of the first tuning-fork type crystal vibrating piece 20 is about in a range of 1.50 mm to 2.00 mm. A width W1 of the first base portion 23-1 is about in a range of 0.34 mm to 0.50 mm, and a width W2 of the second base portion 23-2 is about in a range of 0.40 mm to 0.60 mm.

As shown in FIG. 1B, a thickness D1 of the base portion 23 and a thickness D4 of the vibrating arms 21 are in a range of 80 µm to 120 µm, a thickness D2 of the grooves is a range of 20 µm to 30 µm, and a thickness D3 of the tuning portion 28 for frequency adjustment is range of 20 µm to 80 µm. The thickness D1 of the base portion 23 and the thickness D4 of the vibrating arms are equal. The thickness D3 of the tuning portion 28 for frequency adjustment can be the same thickness of the thickness D2 of the grooves.

On upper and lower surfaces of the vibrating arms 21 of the first tuning-fork type crystal vibrating piece 20, respective grooves 24 are formed. One groove 24 is formed on one surface of one vibrating arm 21 yielding four grooves 24 are formed on the pair of vibrating arms 21. The depth of groove 24 is about 35% to 45% of the thickness of the vibrating arm 21. The width of groove 24 is about 65% to 85% of the width of the vibrating arm 21. If the width is more than 85%, strength of the vibrating arms is decreased. As shown in FIG. 1C, a cross-section of a vibrating arm 21 having grooves 24 on the upper and lower surfaces have a substantially H-shaped transverse profile. The length of groove 24 is 70% to 77% of the entire length of the vibrating arm 21. The groove 24 is formed in order to lower CI value because CI value increases as it is miniaturized.

The base portion 23 of the first tuning-fork type crystal vibrating piece 20 is formed in a board shape. A slit (not shown) can be formed between the first base portion 23-1 and the second base portion 23-2. With the slit, leakage of oscillation of the vibrating arms 21 to the second base portion 23-1 can be absorbed, including oscillation in a vertical direction which occurs when the vibrating arms oscillate. Also, even if the width of slit becomes narrower, the thickness of the base portion 23 is thick enough so that it is not broken during manufacturing process and also it is resistant to impact or oscillation. The base portion 23 of the first tuning-fork type crystal vibrating piece 20 is provided with two of connecting portions 27. The connecting portions 27 connect the first tuning-fork type crystal vibrating piece 20 and the single crystal wafer when the tuning-fork profile shown in FIG. 1A is formed by photolithography and wet etching.

As shown in FIG. 1A, a first base electrode 31 and a second base electrode 32, and a first excitation electrode 33 and a second excitation electrode 34 are formed on the base portion 23 and the vibrating arms 21 of the tuning-fork type crystal vibrating piece. At the distal ends of the vibrating arms 21, the tuning portions 28 for frequency adjustment are formed on the base portion 23 and the vibrating arms 21 of the first tuning-fork type crystal vibrating piece 20. The first and second base electrode 31 and 32, the first and second excitation electrode 33 and 34, and the metal film formed on the tuning portion 28 for frequency adjustment are formed with the same thickness. The configuration is that 400 to 2000 angstroms of a gold (Au) layer is layered on 150 to 700 angstroms of chrome (Cr) layer. Instead of a chrome (Cr) layer, a titanium (Ti) layer can be used, and a silver (Ag) layer instead of a gold (Au) layer can be used. The metal film 18 of the tuning portion 28 for frequency adjustment is formed to adjust frequency of the first tuning-fork type crystal vibrating piece 20. As shown in FIG. 1C, the first and second excitation electrode 33 and 34 are formed on the grooves 24 and side surfaces of the vibrating arms 21.

FIG. 2A shows the relation between the thickness D3 of the tuning portion 28 of the vibrating arms 21 for frequency adjustment and frequency adjustment amount. The vertical axis shows the frequency adjustment amount, which is variability changed by trimming of the metal film of the tuning portion for frequency adjustment. The horizontal axis shows the thickness of the tuning portion 28 for frequency adjustment. When the thickness and dimensions of metal film 18 of the tuning portion 28 for frequency adjustment are maintained constant and the thickness D3 of the tuning portion 28 is formed thick, the frequency adjustable range becomes smaller. This relation is a linear relation. When the thickness and dimensions of metal film 18 of the tuning portion 28 for frequency adjustment are maintained constant and the thickness D3 of the tuning portion 28 is formed thin, the frequency adjustable range becomes larger. Therefore, as the thickness of the D3 of the tuning portion 28 for frequency adjustment is formed thin, the frequency adjustment would be easier.

That is, the first tuning-fork type crystal vibrating piece 20 shown in FIG. 1A has thin thickness D3 of the tuning portion 28 for frequency adjustment and a part of the metal film 18 formed on the tuning portion 28 for frequency adjustment is trimmed. Although the dimensions of the metal film 18 are small, the frequency adjustable range is large so that frequency can be adjusted to the predetermined frequency easily. The metal film 18 of the tuning portion 28 for frequency adjustment can be formed only one side or on both sides.

FIG. 2B shows the relation between the thickness of the metal film 18 of the tuning portion 28 for frequency adjustment and frequency adjustment amount. The vertical axis shows frequency adjustment amount and the horizontal axis shows the thickness of the metal film 18 of the tuning portion 28 for frequency adjustment. When the thickness of the metal film 18 of the tuning portion 28 for frequency adjustment is formed thick, the frequency adjustable range becomes larger. This relationship is a linear relation.

Although it is not particularly shown in FIG. 1A, if the metal film 10 is formed thicker, the frequency adjustable range can be larger so that the frequency can be easily tuned to a predetermined frequency.

Figure 3A:
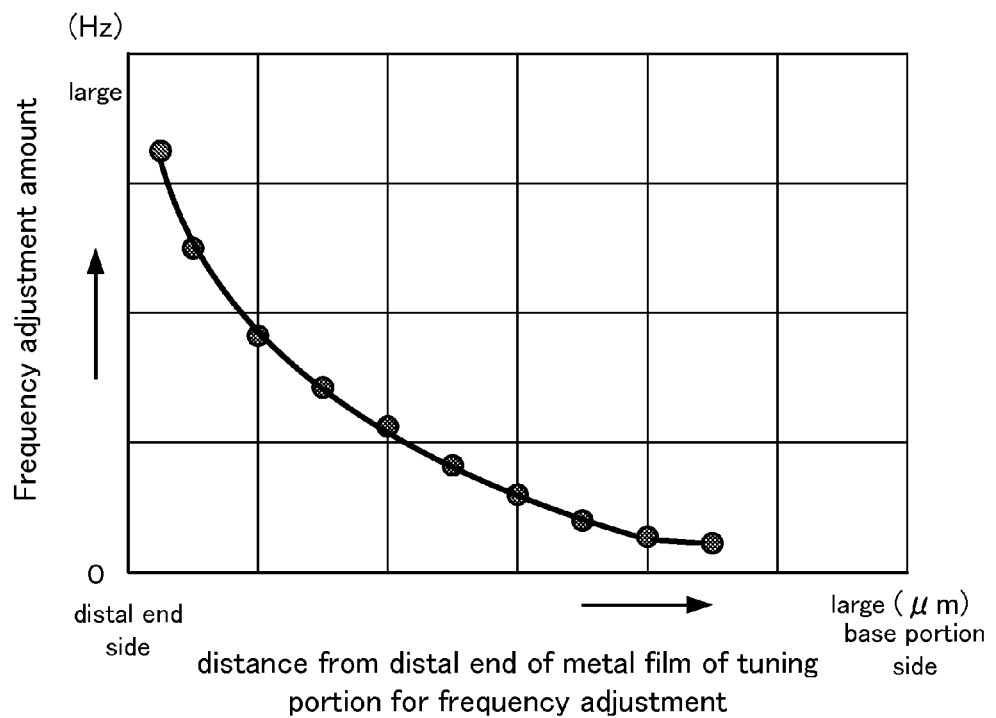
FIG. 3A shows the relation between the distance from the distal end of the metal film 18 of the tuning portion 28 for frequency adjustment and frequency adjustment amount.

FIG. 3A shows the relationship between the location of the tuning portion metal film 18 and the frequency adjustment amount. The curve of FIG. 3A shows that tuning portion metal film 18 located at the distal end of the tuning portion 28 has a greater influence on the frequency adjustment amount than tuning portion metal film 18 located at the proximal end of the tuning portion 28 (adjacent the connection point P1) for a tuning portion configuration where the width and thickness of the tuning portion 28 are constant over the length of the tuning portion (as shown in FIG. 1B). As FIG. 3A shows, the frequency adjustment amount for each unit of metal film 18 is larger at the distal end of the tuning portion 28 and becomes smaller as the tuning portion 28 progresses toward the connection point P1 (and base portion 23) in an exponential relationship. In other words, the influence of a unit of metal film 18 on frequency adjustment increases exponentially with distance from the base portion 23. Frequency adjustment is performed by using a laser beam to evaporate (sublimate or remove) some of the metal film 18 of the tuning portion 28. For example, when a side of the distal end of the metal film 18 is trimmed 10 μm, the frequency adjustment amount is about 600 Hz, but when the same amount of metal film is removed from a location adjacent the connection point P1 (base portion side) of the metal film 18, the frequency adjustment amount is about 50 Hz.

Figure 3B:
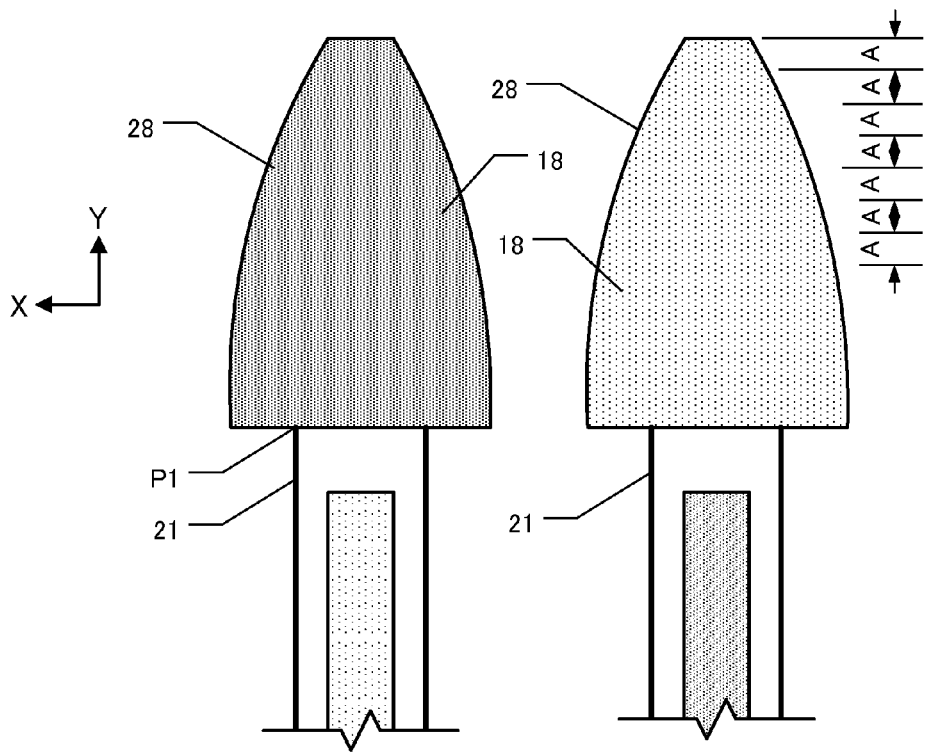
FIG. 3B is a partial enlarged top view of the tuning portion 28 for frequency adjustment formed based on the result of FIG. 3A.

FIG. 3B is a partial enlarged top view of the tuning portion 28 for frequency adjustment formed based on the curve line shown in FIG. 3A. The side lines (Y-direction) of the tuning portion 28 for frequency adjustment form curved lines from the distal end to the connection point P1. The connection point P1 is a point that the (first) thickness of the vibrating arms 21 changes to the (second/reduced) thickness of the tuning portion 28. The curved line of each side of the tuning portion 28 is a half slope of the curve shown in FIG. 3A. That is, width of the tuning portion 28 for frequency adjustment is proportional to the inverse number of the frequency adjustment amount so that each unit of length A of the tuning portion 28 has a constant adjustment effect on the frequency adjustment amount. In other words, the exponential curve shown in FIG. 3A is reduced to half and applied to each side of the tuning portion 28. The resulting tuning portion configuration shown in FIG. 3B allows the resonant frequency of the tuning-fork type crystal vibration pieces to be adjusted in a linear fashion by removal of metal film 18 from the distal end of the tuning portion 28. By adjusting the frequency of the small-sized tuning-fork type crystal vibration pieces in a linear fashion, work efficiency would be improved.

<Configuration of First Crystal Device 100>

Figure 4A:
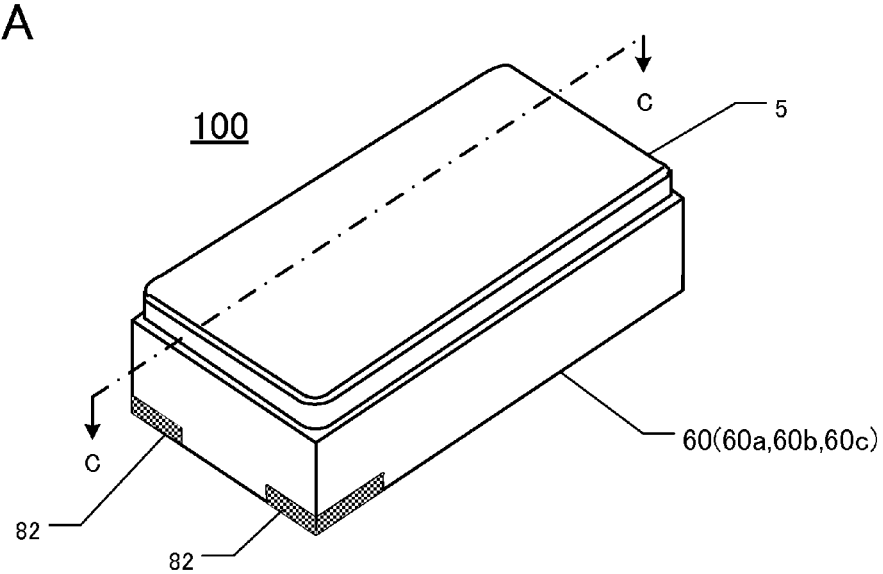
FIG. 4A is a perspective view of the first piezoelectric device 100
Figure 4B:
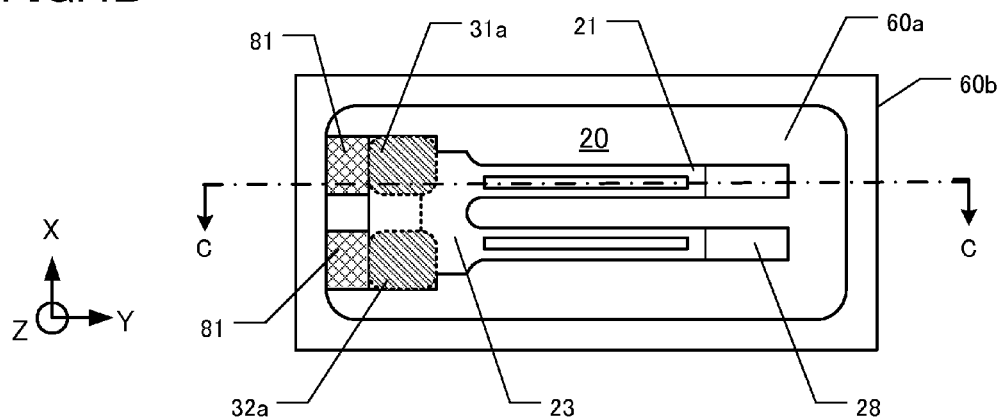
FIG. 4B is a top view of the first piezoelectric device 100 where the first lid plate 5 is removed.
Figure 4C:
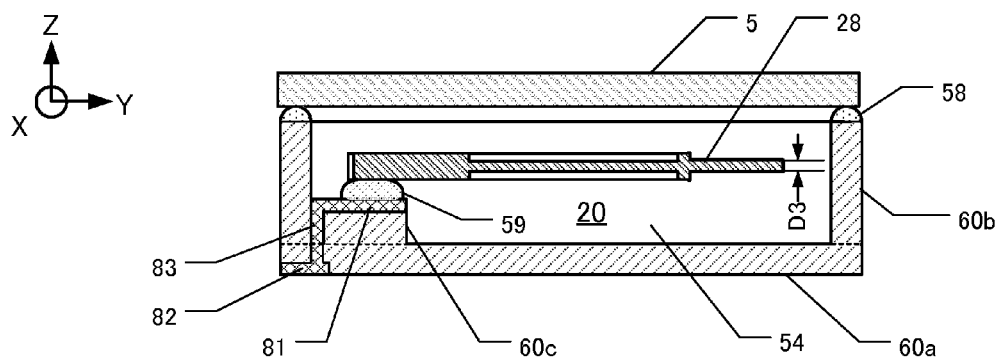
FIG. 4C is a cross-sectional view of the first piezoelectric device 100.

The first crystal device 100 of each embodiment of present invention is explained below by referring figures. FIG. 4A is a perspective view of the first piezoelectric device 100. FIG. 4B is a top view of the first piezoelectric device 100 where the first lid plate 5 is removed. FIG. 4C is a cross-sectional view of the first piezoelectric device 100. For convenience for explanation, electrode shown in FIG. 1A is not illustrated.

The first crystal device 100 which is surface-mount device type is comprised of a ceramic package 60 having insulating property and a first lid plate 5 made of glass and covering the first tuning-fork type crystal vibrating piece 20. The first lid plate 5 is formed of borosilicate glass or soda glass. The ceramic package 60 comprises a bottom ceramic layer 60a, a frame ceramic layer 60b, and a mount base 60c. The ceramic package 60 is formed by layering and burning a plurality of base boards formed of ceramic green sheet made of mixture of aluminum oxide. As shown in FIG. 4C, the package 60 comprising a plurality of ceramic layers (60a, 60b and 60c) forms a cavity 54 and the first tuning-fork type crystal vibrating piece 20 is mounted in the cavity 54.

An electrode pattern is formed on the vibrating arms 21 and the base portion 23 of the first tuning-fork type crystal vibrating piece 20. A wiring pattern of the base portion 23 has an adhesive area 31a and 32a conducting to the electrically conductive adhesive 59. The tuning-fork type crystal vibrating piece 20 is bonded by the electrically conductive adhesive 59 and placed so as to be horizontal to the bottom ceramic layer 60a.

A conductive wiring 81 conducting the adhesive area 31a and 32a of the first tuning-fork type crystal vibrating piece 20 is formed on the surface of the mount base 60c. At least two of external electrodes 82 formed on the bottom of the ceramic package 60 act as external terminals when the first crystal device 100 is mounted on a surface of non-illustrated print board. An internal wiring 83 is an electrical conductive portion connecting the conductive wiring 81 and the external wiring 82. Adhesive 58 is applied on the frame ceramic layer 60b.

For making the ceramic package 60, the transparent glass-made first lid plate 5 is bonded by the adhesive 58 after the first tuning-fork type crystal vibrating piece 20 is mounted. Because the transparent glass-made first lid plate 5 is used for the ceramic package 60, a laser beam can be irradiated from outside to a part of the metal film 18 of the tuning portion 28 for frequency adjustment within a vacuum state. By trimming the part of the metal film 18 of the tuning portion 28 for frequency adjustment with the laser light, frequency can be finely-adjusted by mass reducing method. After frequency adjustment and inspection, the first crystal device 100 is completed.

FIG. 5 through FIG. 8 show alternative examples whose shapes of tuning portion 28 and shapes of vibrating arms 21 are changed. The same numberings are used for the same members of the first tuning-fork type crystal vibrating piece 20 and different numberings are used for different members. The cross sections of the second and third tuning-fork type crystal vibrating pieces 20A and 20B are the same of the first tuning-fork type crystal vibrating piece 20 so that the drawings are omitted. The top views of sixth and seventh tuning-fork type crystal vibrating pieces 20E and 20F shown in FIGS. 8A and 8B are omitted.

Figure 5A:
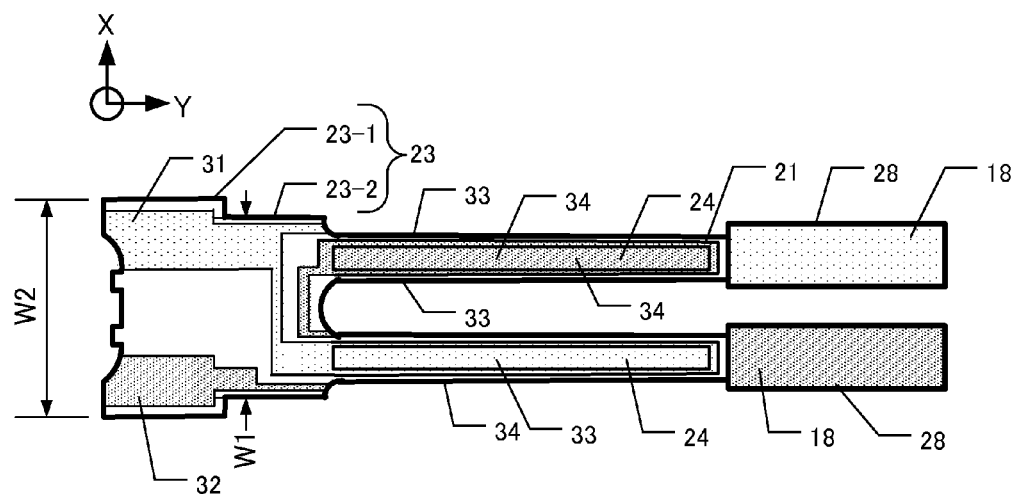
FIG. 5A is a top view of the second tuning-fork type crystal vibrating piece 20A.

FIG. 5A is a top view of the second tuning-fork type crystal vibrating piece 20A of first alternative example. The tuning portions 28 for frequency adjustment of the vibrating arms 21 of the second tuning-fork type crystal vibrating piece become wider in a constant width and form hammer-head portions. In order to acquire larger range of frequency adjustable amount, the tuning portion 28 for frequency adjustment is formed thinner. The first excitation electrode 33 and the second excitation electrode 34 are formed on the upper, lower, and side surfaces of the pair of vibrating arms 21. The metal film 18 of the tuning portion 28 for frequency adjustment is formed on the distal end. The first excitation electrode 33 is connected to the first base electrode 31 and the second excitation electrode 34 is connected to the base electrode 32.

Figure 5B:
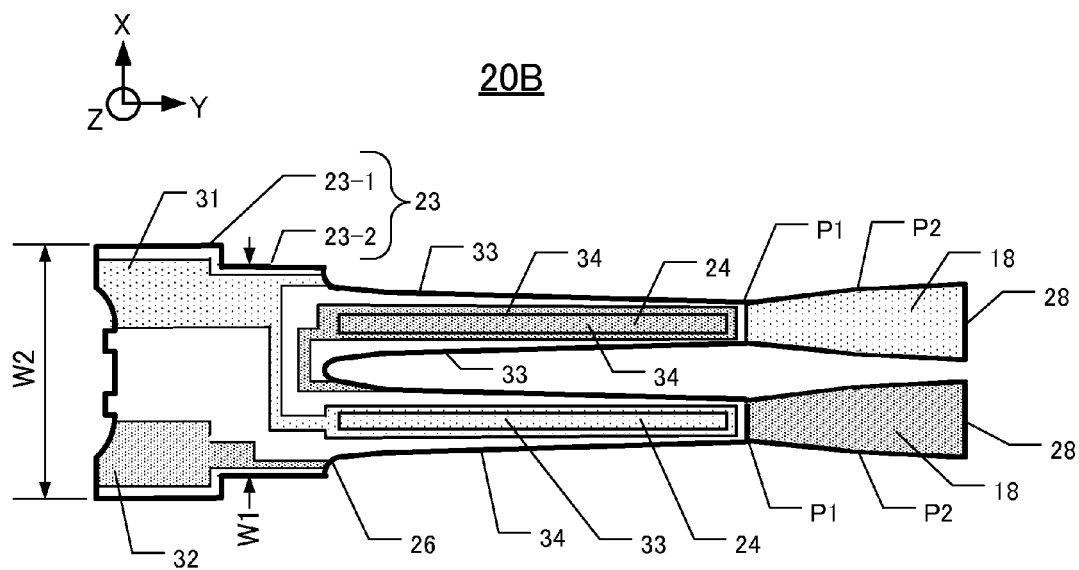
FIG. 5B is a top view of the third tuning-fork type crystal vibrating piece 20B.

FIG. 5B is a top view of the third tuning-fork type crystal vibrating piece 20B of second alternative example. As shown in FIG. 5B, the vibrating arms 21 extend from the base portion 23 become narrower from the root portion 26 toward the first connection point P1. Then, from the first connection point P1 situated at a constricted part, the vibrating arms 21 become suddenly wider toward the connection point P2 and after passing the connection point P2, the vibrating arms 21 become gradually wider within a range that both arms do not touch each other and form the tuning portion 28 for frequency adjustment having thinner profile.

Because the vibrating arms 21 become narrower from the root portion toward the first connection point P1 situated at the constricted part and then become wider toward the distal end, dimensions ratio of the vibrating arms 21 and the tuning portion 28 for frequency adjustment become larger and large range of frequency adjustable amount can be acquired. The constricted portion on the vibrating arms 21 narrows the width of vibrating arms. Forming a constriction of the vibration arms 21 generate a synergistic effect with the tuning portion 28 for frequency adjustment, because the width of vibrating arms 21 become narrower. Also concentrated stress at root portion moves to the distal end of the vibrating arms 21, so oscillation leakage to the base portion can be reduced. Controlling the width of the first connection point P1 of the constriction portion suppresses CI value, prevents oscillation in second harmonic wave, and enables to oscillate stable fundamental wave.

Figure 6A:
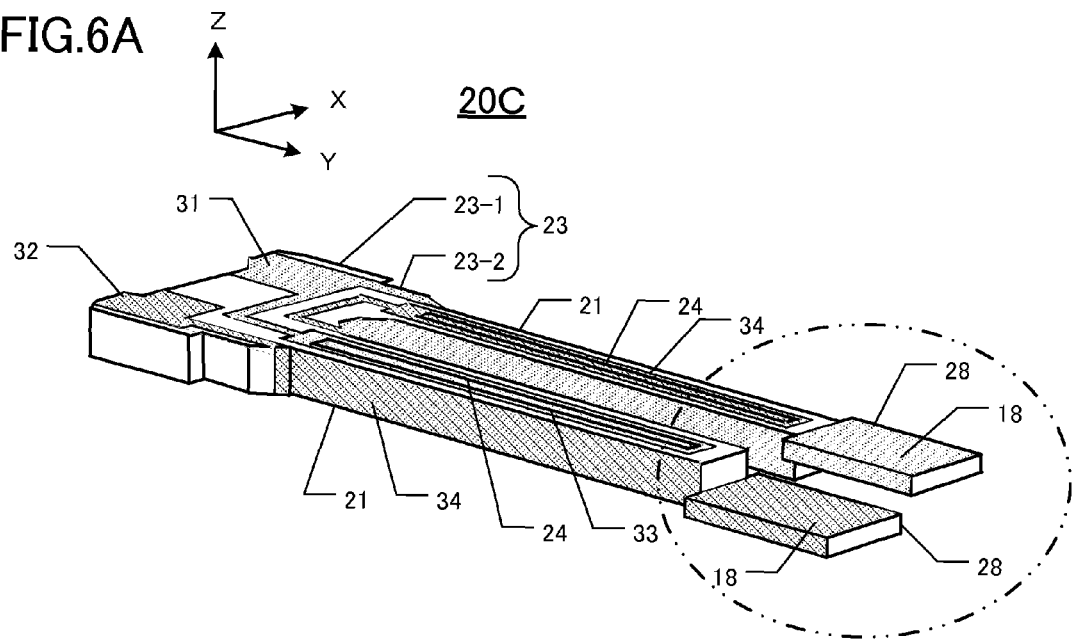
FIG. 6A is a perspective view of the forth tuning-fork type crystal vibrating piece 20C.

FIG. 6A is a perspective view of the fourth tuning-fork type crystal vibrating piece 20C of third alternative example. As it is shown, the tuning portions 28 for frequency adjustment are formed at the distal ends of the vibrating arms 21 extended from the base portion 23. One of the tuning portions 28 is formed at upper half of the arm if it is seen from Y-direction and the other tuning portion 28 is formed at lower half of the arm if it is seen from Y-direction. As shown in FIGS. 5A and 5B, if the widths of tuning portion 28 are formed wide, they may collide easily each other when they are oscillated. Thus, there is a limit to the amount the width of the tuning portion 28 can be increased for frequency adjustment. However, the tuning portion 28 for frequency adjustment shown in FIG. 6A is formed at upper half and lower half respectively so that the tuning portions 28 having increased width do not collide when they oscillate. When they are seen from Z-direction, a part of each tuning portion 28 overlaps when oscillate. By forming the width of the tuning portion 28 wider, the dimensions of frequency adjustment become larger so that the forth tuning-fork type crystal vibrating piece 20C enables to obtain larger frequency adjustable range.

Figure 6B:
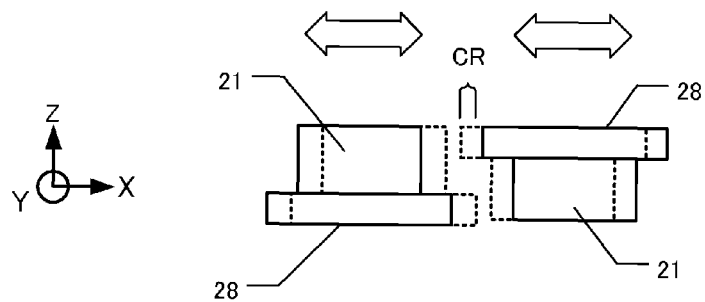
FIG. 6B is a simulated drawing of the tuning portion 28 for frequency adjustment and the vibrating arms 21 seen from Y-direction.

FIG. 6B is a simulated drawing of the tuning portion 28 for frequency adjustment and the vibrating arms 21 seen from Y-direction. Note that the metal film is not illustrated on FIG. 6B.

The pair of vibrating arms 21 oscillates in the direction shown with arrows and the dotted lines show when the vibrating arms 21 oscillate toward the center CR. When the tuning portions 28 for frequency adjustment oscillate maximum, they overlap as shown with the area CR seen from Z-direction. If the tuning portion 28 is not formed at upper half and lower half on the vibrating arms 21 respectively, they collide each other. However, the tuning portion 28 is formed at upper half and lower half on the vibrating arms 21 respectively, the collision can be prevented. The tuning portions 28 are configured to oscillate in separated planes so they do not touch during oscillation.

Figure 7A:
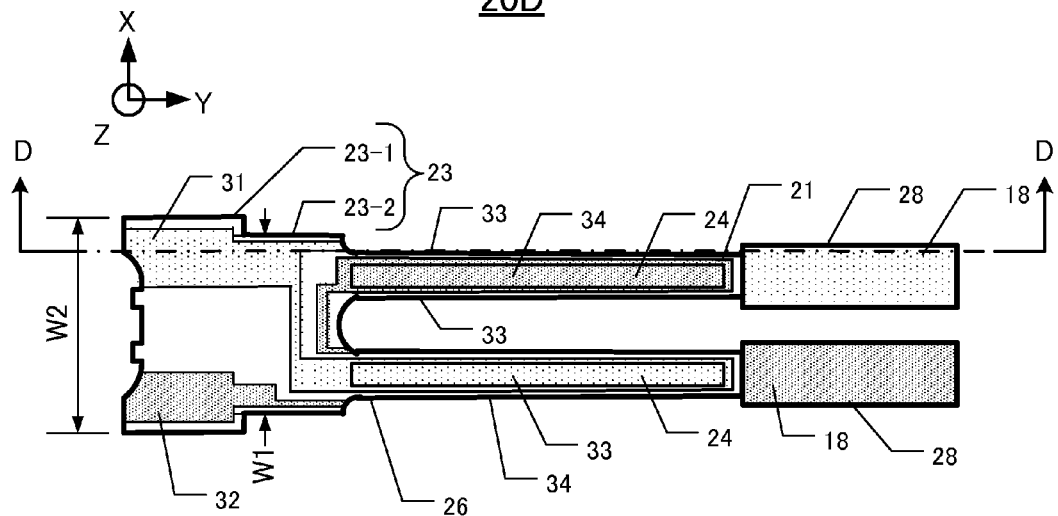
FIG. 7A is a top view of the fifth tuning-fork type crystal vibrating piece 20D.
Figure 7B:
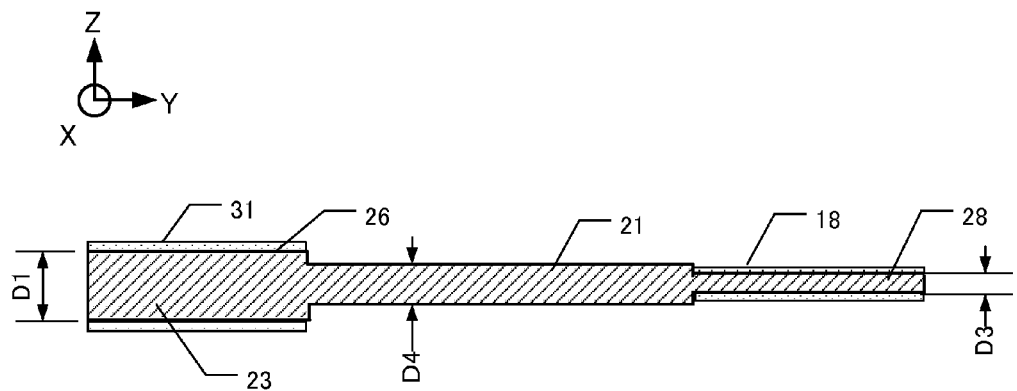
FIG. 7B is a cross-sectional view taken along the D-D line of FIG. 7A.

FIG. 7A is a top view of the fifth tuning-fork type crystal vibrating piece 20D of a fourth alternative example. FIG. 7B is a cross-sectional view taken along the D-D line of FIG. 7A. The cross section of D-D is not a cross section of grooves 24. The tuning portion 28 for frequency adjustment of the vibrating arms 21 of the fifth tuning-fork type crystal vibrating piece 20D forms hammer-head portion with a constant width.

As shown in FIG. 7B, the thickness D1 of the base portion 23 is in a range between 80 μm to 120 μm, the thickness D4 of the vibrating arms 21 is in a range between 40 μm to 80 μm, and the thickness D3 of the tuning portion 28 for frequency adjustment is in a range between 20 μm to 50 μm. The thickness of the base portion 23 is maintained with the thickness D1 up to the top portion 26 of the root portion of the vibrating arms 21, and then the vibrating arms 21 extend up to the tuning portion 28 for frequency adjustment with the thickness D4. Thus, the surface of the vibrating arms 21 and the base portion 23 are uneven. The thickness D4 of the vibrating arms 21 and the thickness D3 of the tuning portion 28 for frequency adjustment are different, and the surfaces of the tuning portion 28 and of the vibrating arms 21 are formed uneven. That is, the thicknesses are in relation of D1>D4>D3. Oscillation frequency can be lowered and larger range of frequency adjustable amount can be acquired by forming vibrating arms 21 and the tuning portion 28 having thinner thickness than the thickness D1 of the base portion 23.

Figure 8A:
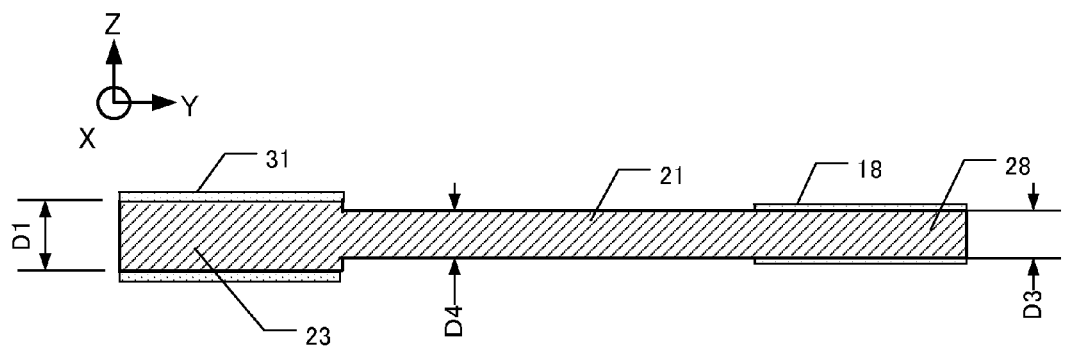
FIG. 8A is a top view of the sixth tuning-fork type crystal vibrating piece 20E.

FIG. 8A is a top view of the sixth tuning-fork type crystal vibrating piece 20E of a fifth alternative example. FIG. 8A is cross-section figure of D-D (except area of the grooves 24) as the same as FIG. 7A. A different point of the six tuning-fork type crystal vibrating piece 20E and the fifth tuning-fork type crystal vibrating piece 20D is that the thickness D4 of the vibrating arms 21 and the thickness D3 of the tuning portion 28 for frequency adjustment of the sixth tuning-fork type crystal vibrating piece 20E are formed the same thickness. The thickness D4 and the D3 are formed thinner than the thickness D1. Although the depth of groove 24 of the vibrating arm 21 is shallow because the thickness D4 of the vibrating arm 21 is thin, larger range of the frequency adjustable range can be obtained.

Figure 8B:
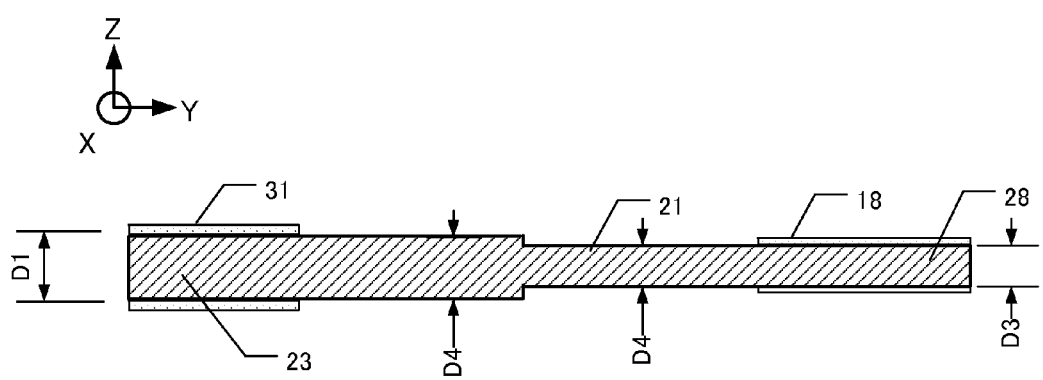
FIG. 8B is a cross-sectional view of the seventh tuning-fork type crystal vibrating piece 20F.

FIG. 8B is a cross-sectional view of the seventh tuning-fork type crystal vibrating piece 20F of a sixth alternative example. The cross section of D-D is not a cross section of grooves 24 as same as FIG. 7A. The thickness D1 of the base portion 23 and the thickness of D4 of the vibrating arms 21 of the seventh tuning-fork type crystal vibrating piece 20F are formed the same thickness, but the thickness D4 of the vibrating arms 21 becomes thinner in a middle of the length. The thickness D4 becomes the same thickness of the thickness D3 of the tuning portion 28 for frequency adjustment in the middle of the length of the vibrating arm 21 toward distal end. The seventh tuning-fork type crystal vibrating piece 20F can ensure the depth of groove 24 of the vibrating arm 21 so that CI value can be lowered and large range of the frequency adjustable range can be acquired.

<Manufacturing Steps of First Crystal Device 100>

Figure 9:
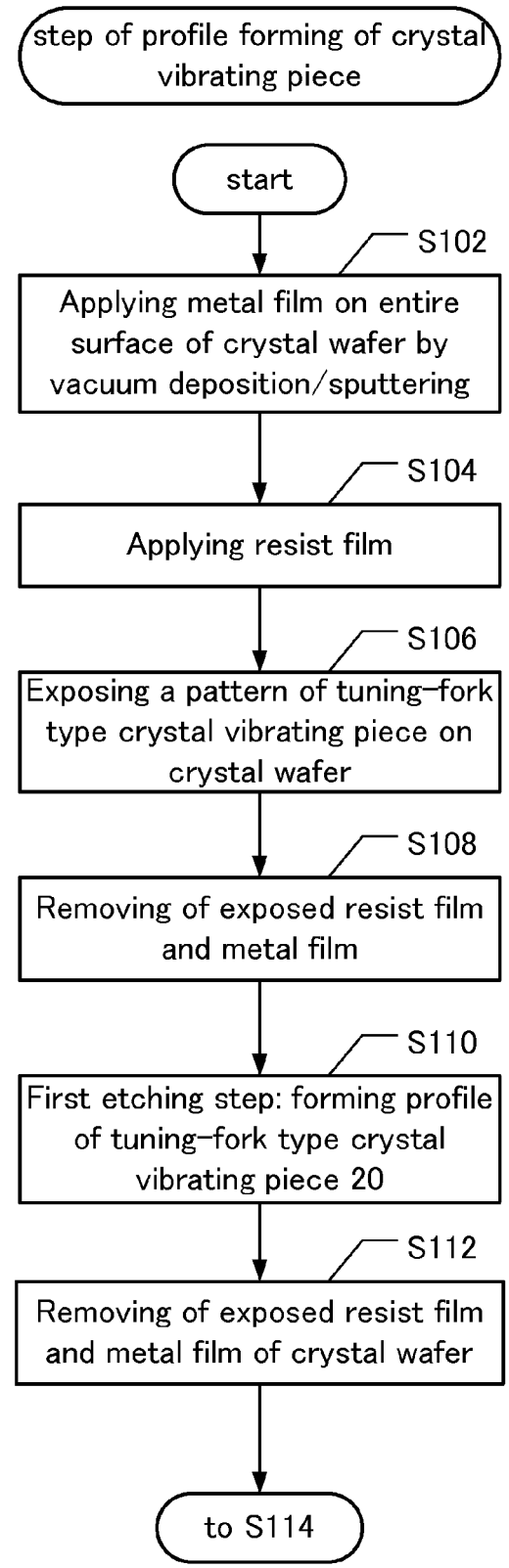
FIG. 9 is a flow chart showing steps of profile forming of the first tuning-fork type piezoelectric vibrating piece 20.
Figure 10:
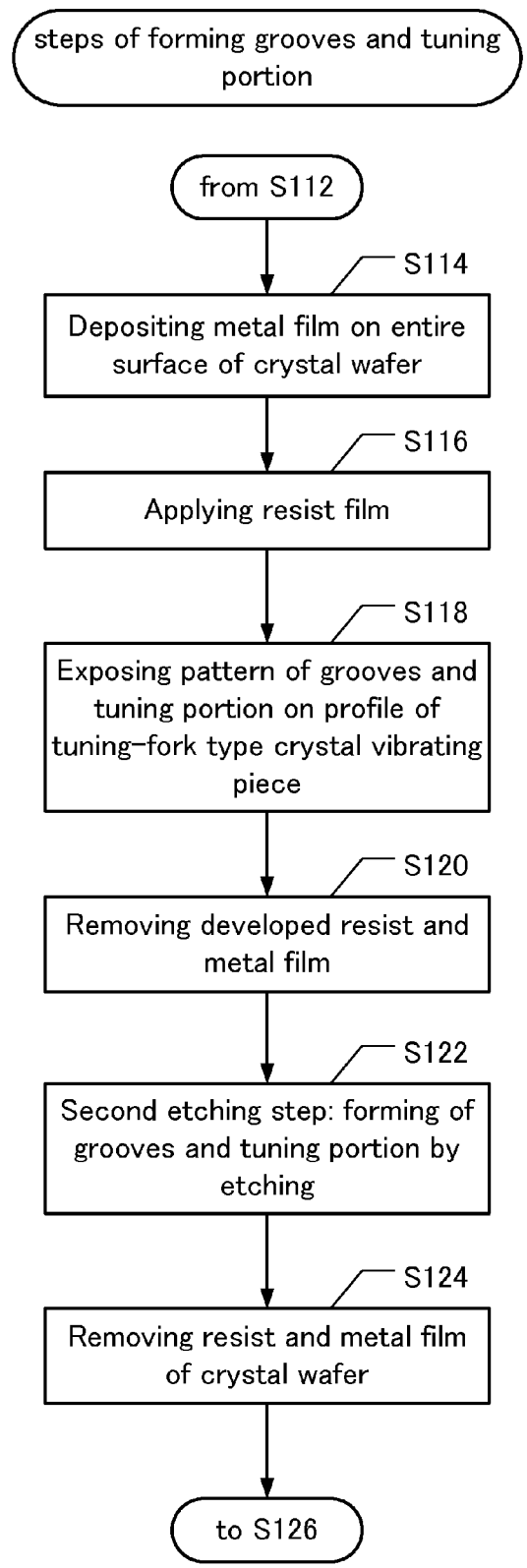
FIG. 10 is a flow chart showing steps of forming the groove 24 and the tuning portion 28 for frequency adjustment on the vibrating arms 21.
Figure 11:
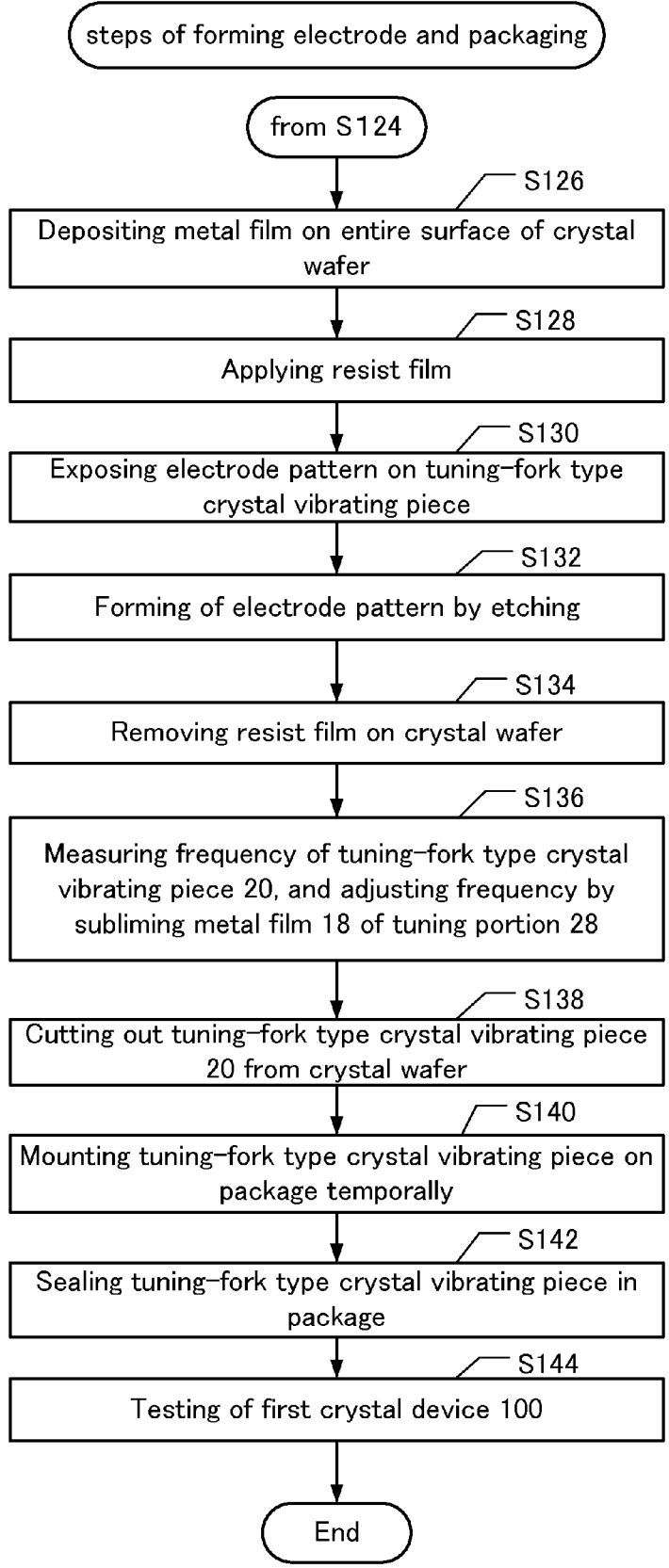
FIG. 11 is a flow chart showing steps of forming of electrode patterns and packaging.

FIG. 9 through FIG. 11 show flow-charts showing steps of profile forming of the first tuning-fork type piezoelectric vibrating piece 20.

<Step of Forming Profile of Crystal Vibrating Piece>

FIG. 9 is a flow chart of profile forming steps of the first tuning-fork type crystal vibrating piece 20 shown in FIG. 1.

In step S102, a corrosion-resistant film is formed on entire surface of a crystal single wafer by a sputtering or deposition method. That is, when the single crystal wafer is used as a piezoelectric material, forming gold (Au) or silver (Ag) layer directly on the single crystal wafer is not easy, so a chrome (Cr) or titanium (Ti) layer is used as a substrate layer. In this embodiment, a double-layered metal film that a gold layer is layered on a chrome layer is used.

In step S104, a photoresist film is applied evenly by spin coating method on the crystal wafer on which a chrome layer and a gold layer are formed. For the photoresist film, for example, a photoresist made of novolak resin can be used.

Next in step S106, by using a non-illustrated exposure device, as a first exposing step, a non-illustrated pattern of first profile photo mask is exposed on the crystal wafer on which a photoresist film is applied. The pattern is exposed on both surfaces of crystal wafer so as to be wet-etched from both surfaces.

In step S108, the pattern-exposed photoresist layer is developed, and the exposed photoresist is removed. Portions of the gold layer now revealed by removal of the exposed photoresist are etched using an aqueous solution of iodine and potassium iodide. Then, portions of the underlying chrome layer revealed by removing corresponding portions of the gold layer are etched using, for example, an aqueous solution of ceric di-ammonium nitrate and acetic acid. The concentrations of these etchants, etching temperature, and etching time are controlled to avoid over-etch. Completion of etching results in complete removal of the corrosion-resistance film from the revealed locations.

In step S110, in a first etching step, portions of crystal wafer 10 revealed by removal of the photo-resist film and corrosion-resistance film is etched by using hydrofluoric acid as etchant so as to become a profile of the first tuning-fork type crystal vibrating piece 20. This wet etching process takes various time depend on concentration, types or temperature of the hydrofluoric acid.

In step S112, the first tuning-fork type crystal vibrating piece 20 is formed by removing unneeded photoresist film and metal film. Note that the single crystal wafer and the first tuning-fork type crystal vibrating piece 20 are connected by the connecting portion 27. The connecting portion 27 formed on the base portion 23 connects the single crystal wafer and the first tuning-fork type crystal vibrating piece 20 and handles them together. Thus, a plurality of first tuning-fork type crystal vibrating piece 20 can be formed and handled in one single crystal wafer.

<Step of Forming Grooves and Tuning Portion for Frequency Adjustment>

FIG. 10 is a flow chart showing steps of forming the groove 24 and the tuning portion 28 for frequency adjustment on the vibrating arms 21.

In step S114, the first tuning-fork type crystal vibrating piece 20 is washed by purified water, and then a corrosion-resist film is formed on entire surface of the first tuning-fork type crystal vibrating piece 20 in order to form grooves 24 and the tuning portions 28 for frequency adjustment.

In step S116, a photoresist film is applied by spraying on entire surface. Because profiles of the first tuning-fork type crystal vibrating pieces 20 are already formed, the photoresist film is also applied on the side surfaces by spraying.

In step S118, as a second exposing step, a second photo mask corresponding to the grooves 24 and the tuning portions 28 for frequency adjustment is prepared, and then it is exposed on the single crystal wafer on which the photoresist film is applied. The grooves 24 and the tuning portions 28 for frequency adjustment are needed to be formed on both surfaces of the vibrating arms 21, so the pattern is exposed on both surfaces of the first tuning-fork type crystal vibrating piece 20.

In step S120, the pattern-exposed photoresist layer is developed, and the exposed photoresist is removed. Portions of the gold layer now revealed by removal of the exposed photoresist are etched. Then, portions of the underlying chrome layer revealed by removing corresponding portions of the gold layer are etched. The concentrations of these etchants, etching temperature, and etching time are controlled to avoid over-etch. Completion of etching results in complete removal of the corrosion-resistance film from the revealed locations.

In step S122, as a second etching step, etching of the groove 24 and the tuning portion 28 for frequency adjustment is performed. That is, portions of crystal material revealed from the photoresist film corresponding to the grooves 24 and the tuning portion 28 for frequency adjustment is etched so as to be profiles of the grooves 24 and the tuning portion 28 for frequency adjustment. Half-etching is performed so as not to fully penetrate the wafer.

In step S124, unneeded photoresist film and metal film are removed. The grooves 24 and the tuning portions 28 for frequency adjustment are already formed in the second etching step.

<Step for Electrode Forming and Packaging>

FIG. 11 is a flow chart showing steps of forming of electrode patterns and packaging.

In step S126, the first tuning-fork type crystal vibrating piece 20 is washed by purified water. Then, a metal film is formed on the entire surface of the first tuning-fork type crystal vibrating piece 20 by a deposition or sputtering method in order to form excitation electrode and other electrodes as driving electrodes.

In step S128, a photoresist film is applied on entire surface by spraying.

In step S130, a non-illustrated photo mask corresponding to the electrode pattern is prepared and the electrode pattern is exposed on the single crystal wafer on which a photoresist film is applied. This pattern is exposed both surfaces of the first tuning-fork type crystal vibrating piece 20 because the electrode patterns are needed to be formed on both surfaces.

In step S132, after developing of photoresist film, exposed photoresist film is removed. Then remaining photoresist film becomes the photoresist film corresponding to the electrode pattern.

Next, etching of metal film to be electrodes is performed. Portions of the gold layer now revealed by removal of the exposed photoresist are etched using an aqueous solution of iodine and potassium iodide. Then, portions of the underlying second chrome layer revealed by removing corresponding portions of the gold layer are etched by, for example, an aqueous solution of ceric di-ammonium nitrate and acetic acid.

In step S134, the photoresist film is removed. After completion of those steps, the base electrodes 31 and 32, excitation electrodes 33 and 34, the metal film 18 of the tuning portion 20 for frequency adjustment are formed at right positions and right electrode width on the first tuning-fork type crystal vibrating piece 20.

In step S136, after measuring frequency of individual first tuning-fork type crystal vibrating piece 20 formed on the single crystal wafer, a laser beam is irradiated to the metal film 18 of the tuning portion 28 for frequency adjustment and the laser beam trims a part of the metal film until frequency becomes nominal target frequency f0. Because many of small first tuning-fork type crystal vibrating pieces 20 are formed on the single crystal wafer, frequency of individual piece 20 may be varied greatly. Even in such condition, the frequency adjustable range of the tuning portion 28 for frequency adjustment having thin profile is large so that the frequency of the first tuning-fork type crystal vibrating piece 20 can be close to nominal target frequency f0. Thus, numbers of first tuning-fork type crystal vibrating piece 20 manufactured from one single crystal wafer increase so that yield ratio is also increased. According to this configuration, the thickness of the metal film 18 of the tuning portion 28 for frequency adjustment is not needed to be thick, thus extra manufacturing steps and forming of expansive extra gold layer are not necessary, and cost can be reduced.

In step S138, the connecting portion 27 of the first tuning-fork type crystal vibrating piece 20 which is being frequency-adjusted is cut and removed from the single crystal wafer.

<Step of Packaging>

After completion of above-mentioned steps, the first tuning-fork type crystal vibrating piece 20 where electrodes are formed is completed. In step S140, electrically conductive adhesive 59 is applied on the mount base 60c of the ceramic package 60 shown in FIG. 2A. Then the first tuning-fork type crystal vibrating piece 20 is mounted on the mount base 60c. Particularly, the connecting areas 31a and 32a of the base portion 23 of the first tuning-fork type crystal vibrating piece 20 is mounted on the applied electrically conductive adhesive 59 and the adhesive 59 is harden temporarily.

In step S142, the ceramic package 60 on which the first tuning-fork type crystal vibrating piece 20 is mounted is moved to a vacuum chamber and the first lid plate 5 is mounted on electrically conductive adhesive 59 to bond the first lid 5 and the ceramic package 60. The electrically conductive adhesive 59 is now completely hardened to complete the first crystal device 100.

In step S144, a laser light is irradiated to the tuning portion 28 for frequency adjustment of the vibrating arms 21 of the fist tuning-fork type crystal vibrating piece 20 mounted on the first crystal device 100 to vapor/sublime the metal film formed on the tuning portion 28 and frequency adjustment can be performed. Finally, tests for such as driving characteristics of the device 100 are performed to complete the first crystal device 100.

Second Embodiment

Figure 12A:
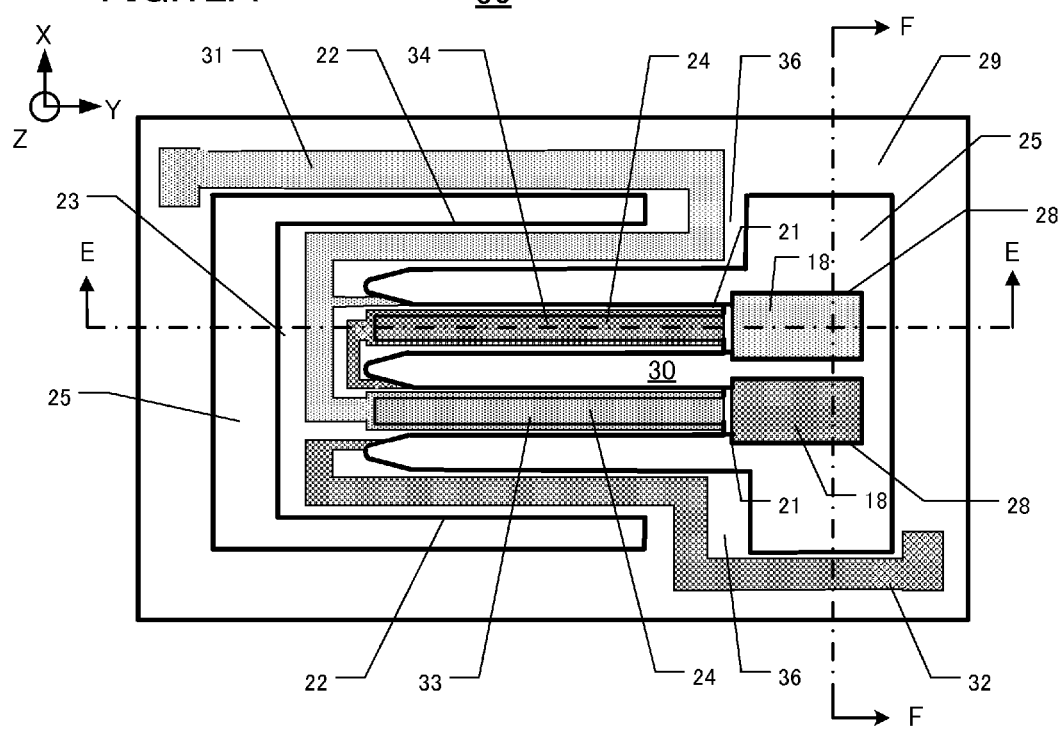
FIG. 12A is a top view showing whole configuration of the crystal frame 50.
Figure 12B:
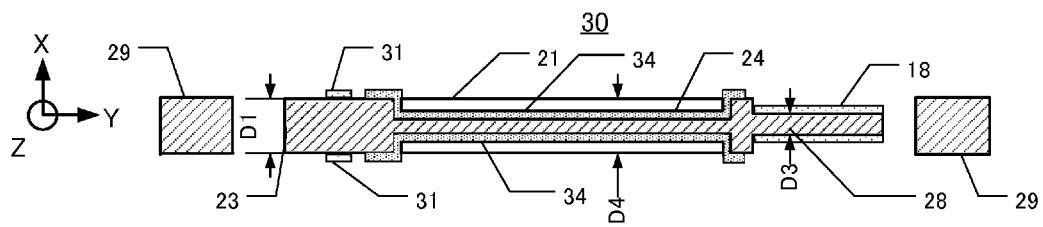
FIG. 12B is a cross-sectional view taken along the E-E line of the FIG. 12A.
Figure 12C:
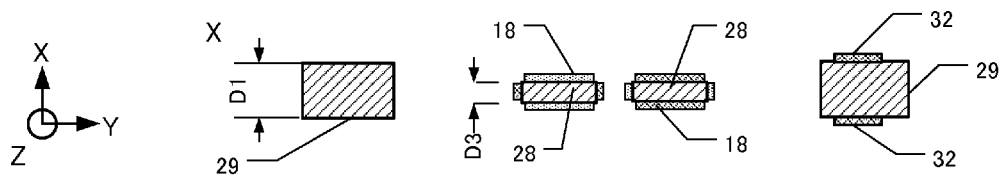
FIG. 12C is a cross-sectional view taken along the F-F line of the FIG. 12B.

FIG. 12A is a top view showing whole configuration of the crystal frame 50. FIG. 12B is a cross-sectional view taken along the E-E line of the FIG. 12A. FIG. 12C is a cross-sectional view taken along the F-F line of the FIG. 12B.

As shown in FIG. 12A, the crystal frame 50 is comprised of an eighth tuning-fork type crystal vibrating piece 30 having the base portion 23 and the vibrating arms 21, the crystal frame portion 29, the supporting arms 22, and the connecting portions 36. And they are formed integrally as the same thickness. A space 25 is formed between the eighth tuning-fork type crystal vibrating piece 30 and the crystal frame portion 29. The crystal frame 50 is further comprised of a first base electrode 31 and a second base electrode 32 on the crystal frame portion 29, the base portion 23, the supporting arms 22, and the connecting portions 36. The eighth tuning-fork type crystal vibrating piece 30 is very small and oscillates at 32.768 kHz.

The space 25 defining the profile of the eighth tuning-fork type crystal vibrating piece 30 is formed by etching. The pair of vibrating arms 21 extends from the base portion 23 in Y-direction. On the upper and lower surfaces of the vibrating arms 21, grooves 24 which are 40% to 65% of the width of vibrating arm are formed. One groove 24 is formed on one surface of one vibrating arm 21 yielding four grooves 24 are formed on the pair of vibrating arms 21. A cross-section of a vibrating arm 21 having grooves 24 on the upper and lower surfaces have a substantially H-shaped transverse profile. The groove 24 is formed in order to lower CI value of the eighth tuning-fork type crystal vibrating piece 30.

The distal end of vibrating arm 21 becomes wider with a constant width and forms a hammer-head portion. The shape of hammer-head portion makes the dimensions of the tuning portion 28 for frequency adjustment large. In order to acquire larger range of the frequency adjustable amount, the tuning portion 28 is formed with thickness D3 which is thinner than the thickness D1 of the base portion 23. The thickness of the supporting arms 22, the connecting portion 36, and the crystal frame portion 29 has the same thickness D1 of the base portion 23.

The shape of tuning portion 28 for frequency adjustment of the eighth tuning-fork type crystal vibrating piece 30 can be the shape shown in FIG. 1A, FIG. 3B or FIG. 5B besides the shape of hammer-head portion. The first excitation electrode 33 and the second excitation electrode 34 are formed on the upper, lower, and side surfaces of the pair of vibrating arms 21. The first excitation electrode 33 is connected to the first base electrode 31 and the second excitation electrode 34 is connected to the second base electrode 32.

The pair of supporting arms 22 extends from the base portion 23 in the same direction that the vibrating arms 21 extend (Y-direction) and connects to the connecting portions 36 and the crystal frame portion 29. The pair of supporting arms 22 reduces oscillation leakage of the vibrating arms 21 to outside and affect of dropping impact or temperature change of outer side of the package.

As shown in FIGS. 12B and 12C, the thickness D3 of the tuning portion 28 and the thickness D4 of the vibrating arms 21 of the eighth tuning-fork type crystal vibrating piece 30 have the same thickness of the first tuning-fork crystal vibrating piece 20 and have the same functions. The tuning portion 28 formed thinner is formed in a longer length than of conventional art in order to be a designated frequency.

<Configuration of Second Crystal Device 110>

FIG. 13A through 13D are schematic views of the second crystal device 110 of second embodiment. The second lid plate 10 and the base plate 40 made of a single crystal wafer sandwich the crystal frame 50 to form the second crystal device 10.

Figure 13A:
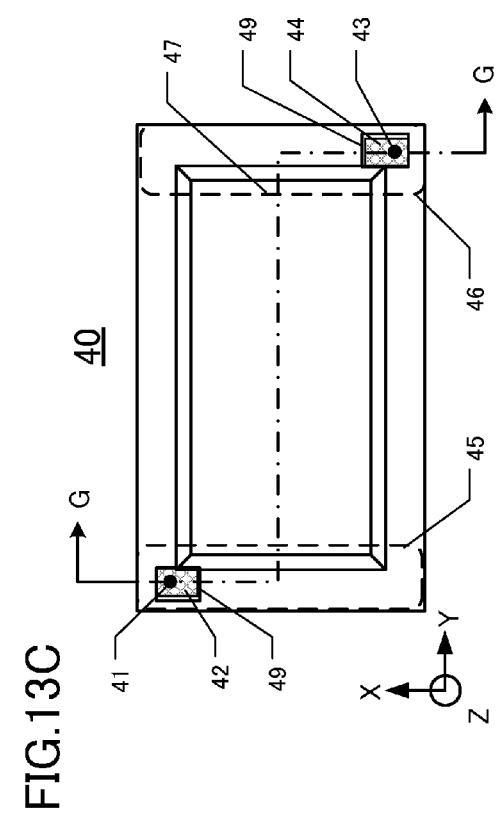
FIG. 13A is a top view of the lid plate 10 made of a single crystal wafer.
Figure 13C:
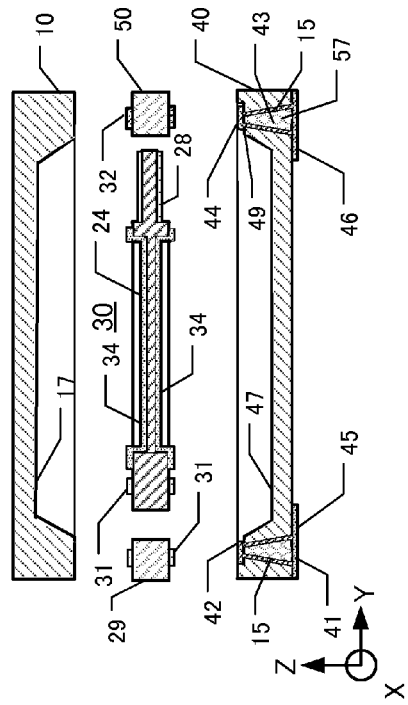
FIG. 13C is a top view of the base plate 40 made of a single crystal wafer.
Figure 13B:
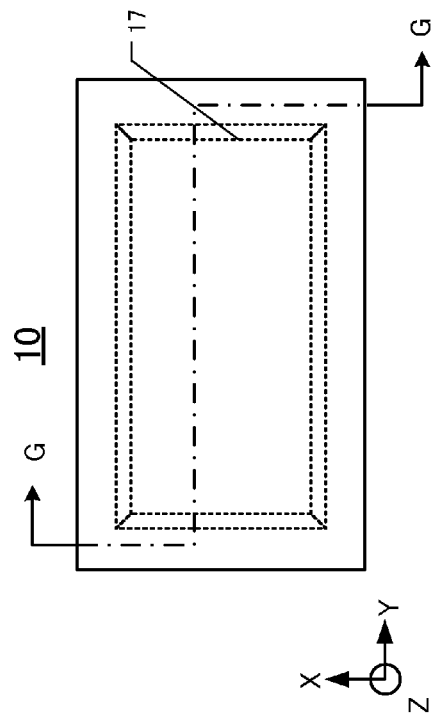
FIG. 13B is a top view of the crystal frame 50 having the eighth tuning-fork type crystal vibrating piece 30.
Figure 13D:
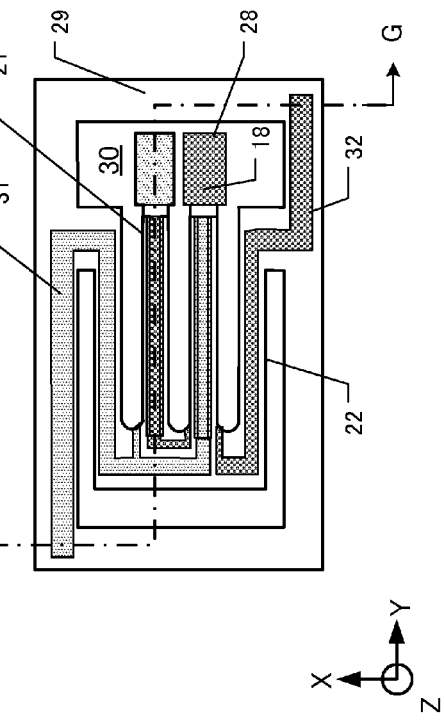
FIG. 13D is a simplified cross-sectional view taken along the G-G line of FIG. 13 A before the each part of second piezoelectric device 110 is layered.

FIG. 13A is a top view of the lid plate 10 made of a single crystal wafer. FIG. 13B is a top view of the crystal frame 50 having the eighth tuning-fork type crystal vibrating piece 30. FIG. 13C is a top view of the base plate 40 made of a single crystal wafer. FIG. 13D is a simplified cross-sectional view taken along the G-G line of FIG. 13A before the each part of second piezoelectric device 110 is layered.

As shown in FIG. 13A, the second lid plate 10 has a concave portion 17 on a side facing the crystal frame 50. FIG. 13B is the same of FIG. 12A, so explanation will be omitted.

As shown in FIG. 13C, the base plate 40 has a concave portion 47 on a side facing the crystal frame 50. When the concave portion 47 is formed, a first through-hole 41, a second through-hole 43, and step portions 49 are formed at the same time. The first connecting electrode 42 and the second connecting electrode 44 are formed on the upper surface of the base plate 40.

As shown in FIGS. 13C and 13D, a metal film 15 is formed inside of the first and second through-hole 41 and 43. The metal film 15 is formed in the photolithography step as the first and second connecting electrode 42 and 44 are formed. The metal film 15 is comprised of a gold (Au) or silver (Ag) layer formed on a chrome (Cr) layer. The base plate 40 is provided with a first external electrode 45 and the second external electrode 46 metalized on the bottom of the base plate 40. The first connecting electrode 42 is connected to the first external electrode 45 formed on the bottom of the base plate 40 via the first through-hole 41. The second connecting electrode 44 is connected to the second external electrode 46 formed on the bottom of the base plate 40 via the second through-hole 43.

The first base electrode 31 and the second base electrode 32 formed on the lower surface of the crystal frame portion 29 are respectively connected to the first connecting electrode 42 and the second connecting electrode 44 formed on the upper surface of the base plate 40. That is, the first base electrode 31 is electrically connected to the first external electrode 45, and the second base electrode 32 is electrically connected to the second external electrode 46.

As shown in simplified cross-sectional view of FIG. 13D, the second lid plate 10 of FIG. 13A, the crystal frame 50 of FIG. 13C, and the base plate 40 are shown. The wafers are layered and bonded in a siloxane bonding manner to form the second crystal device 110. In actual manufacturing process, hundreds to thousands of crystal frames 50, of second lid plates 10, and of base plates 40 are formed on each wafer respectively, and those three wafers are bonded to manufacture hundreds to thousands of second crystal devices 110.

Surfaces of the second lid plate 10, the crystal frame 29, and the base plate 40 are mirrored to bond in a siloxane bonding manner. Then short-wavelength ultraviolet light is irradiated to the bonding surfaces to activate the surfaces and the wafers are layered in oxygen containing atmosphere. The thickness of electrode (3000 Å to 4000 Å) may be a cause of failure. Thus, the surface corresponding to the first and second base electrode 31 and 32 formed on the lower surface of the crystal frame 29 needs to have a concave portion having depth thicker than of the wiring electrode. The bonding surfaces are needed to be formed not to interfere the siloxane bonding.

After the siloxane bonding is finished, the first and second through-hole 41 and 43 of the second crystal device 110 are sealed. For example, germanium and gold alloy of sealing material 57 is placed on the first and second through-hole 41 and 43 and the sealing material 57 is melted in a reflow furnace at about 200 C with a vacuum state or filled with inactive gas. Then, the second crystal device 100 where the package is in vacuum state or filled with inactive gas is formed.

The second crystal device 110 of according to aspects of the disclosure is frequency adjusted (tuned) before the base plate 40 and the crystal frame portion 29 are siloxane-bonded. The frequency adjustment is performed by irradiating a laser light to the metal film 18 of the tuning portion 28 to vapor/sublime the metal film.

Representative embodiments are described above. It will be understood by those skilled in the art that these embodiments can be modified or changed while not departing from the spirit and scope of them and/or of the appended claims. For example, for the piezoelectric vibrating piece, lithium niobate, or other piezoelectric single-crystal material can be used instead of quartz crystal.

What is claimed is:

1. A tuning-fork type piezoelectric vibrating piece constructed of piezoelectric material comprising:
    a base portion;
    a pair of parallel vibrating arms which extend from the base portion, said vibrating arms having a first thickness;
    an excitation electrode film formed on the vibrating arms;
    a tuning portion formed at the distal end of each of the vibrating arms, said tuning portions having a second thickness which is less than the first thickness; and
    a metal film formed on at least one surface of the tuning portion;
    wherein a thickness of the tuning portion is constant over a length of the tuning portion and the tuning portions are configured to oscillate in separate planes whereby said tuning portions do not touch during oscillation.

2. The tuning-fork type piezoelectric vibrating piece of claim 1, wherein each vibrating arm includes a connection point where the first thickness of each vibrating arm meets the second thickness of the tuning portion, a first width of the vibrating arms and a second width of the tuning portion are different and the second width is wider than the first width.

3. A tuning-fork type piezoelectric vibrating piece constructed of piezoelectric material, comprising:
    a base portion having a first thickness;
    a pair of parallel vibrating arms which extend from the base portion and have a second thickness which is less than the first thickness;
    an excitation electrode film formed on the vibrating arms;
    a tuning portion formed at the distal end of each of the vibrating arms and having a third thickness which is less than the second thickness;
    each vibrating arm including a connection point where the second thickness of the vibrating arm meets the third thickness of the tuning portion; and
    a metal film formed on at least one surface of the tuning portion;
    wherein said third thickness of the tuning portion is constant over a length of the tuning portion measured from the connection point to a distal end of said tuning portion.

4. The tuning-fork type piezoelectric vibrating piece of claim 3, wherein a thickness of the excitation electrode film and a thickness of the metal film are the same.

5. The piezoelectric vibrating piece of claim 4, wherein at said connection point, a first width of the vibrating arms and a second width of the tuning portion are different and the second width is greater than the first width.

6. The piezoelectric vibrating piece of claim 3, wherein at said connection point, a first width of the vibrating arms and a second width of the tuning portion are different and the second width is greater than the first width.

7. A piezoelectric device comprising:
    the tuning-fork type piezoelectric vibrating piece according to claim 3, wherein;
    a lid plate covering the piezoelectric vibrating piece; and
    a base plate supporting the piezoelectric vibrating piece.

* * * * *